(12) United States Patent
Weinmann et al.

(10) Patent No.: US 9,640,904 B2
(45) Date of Patent: May 2, 2017

(54) SENSORED CABLE FOR A POWER NETWORK

(71) Applicant: 3M INNOVATIVE PROPERTIES COMPANY, St. Paul, MN (US)

(72) Inventors: Christian Weinmann, Neuss (DE); Holger J. Kurzhals, Neuss (DE); Michael H. Stalder, Neuss (DE); Sebastian Eggert, Neuss (DE); Jens Weichold, Neuss (DE)

(73) Assignee: 3M Innovative Properties Company, St. Paul, MN (US)

( * ) Notice: Subject to any disclaimer, the term of this patent is extended or adjusted under 35 U.S.C. 154(b) by 44 days.

(21) Appl. No.: 14/366,964

(22) PCT Filed: Dec. 19, 2012

(86) PCT No.: PCT/US2012/070569
§ 371 (c)(1),
(2) Date: Jun. 19, 2014

(87) PCT Pub. No.: WO2013/096424
PCT Pub. Date: Jun. 27, 2013

(65) Prior Publication Data
US 2014/0368221 A1    Dec. 18, 2014

Related U.S. Application Data

(60) Provisional application No. 61/662,713, filed on Jun. 21, 2012.

(30) Foreign Application Priority Data

Dec. 21, 2011 (EP) .................................... 11194804
Jul. 19, 2012 (EP) .................................... 12177024

(51) Int. Cl.
G01R 15/16 (2006.01)
H01R 13/58 (2006.01)
(Continued)

(52) U.S. Cl.
CPC ......... *H01R 13/5845* (2013.01); *G01R 15/06* (2013.01); *G01R 15/142* (2013.01);
(Continued)

(58) Field of Classification Search
None
See application file for complete search history.

(56) References Cited

U.S. PATENT DOCUMENTS 4,454,379 A   6/1984 Cleveland
6,015,629 A   1/2000 Heyer et al.
(Continued)

FOREIGN PATENT DOCUMENTS

CN   101196550   6/2008
DE   2409595     8/1975
(Continued)

OTHER PUBLICATIONS

Hobejogi, "Coaxial Capacitive Voltage Divider with High Division Ratio for High Voltage Pulses with Very Fast Rise Times," IEEE, 2011, pp. 1-6.
(Continued)

*Primary Examiner* — Jermele M Hollington
*Assistant Examiner* — Douglas X Rodriguez
(74) *Attorney, Agent, or Firm* — Gregg H. Rosenblatt

(57) ABSTRACT

Sensored cable (1) for distribution of electrical power in a power network, the sensored cable comprising an inner conductor and an insulating layer (10) arranged concentrically around at least an axial section of the inner conductor. The sensored cable further comprises a capacitive voltage sensor (100) for sensing a voltage of the inner conductor,
(Continued)

Figure 1:
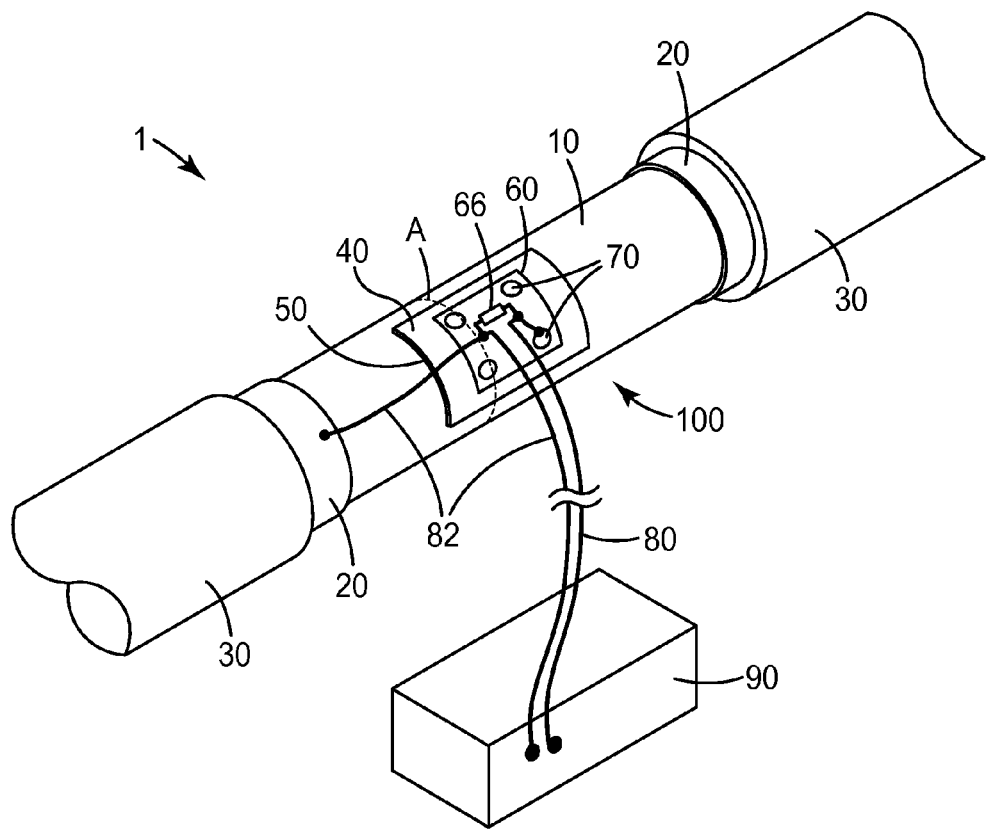

characterized by the sensor including a printed circuit board element (60), which is placed over an electrically isolated piece (140) of conductive or semiconductive material, arranged on the insulating layer of the cable. The electrically isolated piece (140) of conductive or semiconductive material is operable to form an electrode of a sensing capacitor of the capacitive voltage sensor. The cable may comprise a (semi-) conductive layer (20). The electrically isolated piece (40) of conductive or semiconductive material may comprise a portion of the (semi-) conductive layer.

6 Claims, 3 Drawing Sheets

(51) Int. Cl.
*H02G 15/184* (2006.01)
*G01R 15/14* (2006.01)
*G01R 15/06* (2006.01)
*G01R 19/00* (2006.01)
*H01B 9/00* (2006.01)
*H01R 13/66* (2006.01)
*H01R 43/26* (2006.01)
*H02G 15/064* (2006.01)
*G01R 15/18* (2006.01)

(52) U.S. Cl.
CPC ......... *G01R 15/16* (2013.01); *G01R 19/0084* (2013.01); *H01B 9/006* (2013.01); *H01R 13/6683* (2013.01); *H01R 43/26* (2013.01); *H02G 15/064* (2013.01); *H02G 15/184* (2013.01); *G01R 15/181* (2013.01); *Y10T 29/49208* (2015.01)

(56) References Cited

U.S. PATENT DOCUMENTS

| 7,850,492 | B1* | 12/2010 | Straka | H01R 13/6625 439/676 |
|---|---|---|---|---|
| 2002/0010252 | A1 | 1/2002 | Lecoeuvre | |
| 2007/0139848 | A1 | 6/2007 | Harris | |
| 2010/0311281 | A1* | 12/2010 | Prest | H01R 13/035 439/676 |
| 2011/0298454 | A1* | 12/2011 | Ausserlechner | G01R 15/207 324/252 |

FOREIGN PATENT DOCUMENTS

| DE | 3702735 | 8/1988 |
|---|---|---|
| EP | 1195872 | 4/2002 |
| GB | 1058890 | 2/1967 |
| JP | 60256068 | 12/1985 |
| JP | 0520210 | 3/1993 |
| JP | H085697 | 1/1996 |
| JP | H09154210 | 6/1997 |
| JP | 10164746 | 6/1998 |
| TW | 200629686 | 8/2006 |
| TW | I263050 | 10/2006 |
| TW | 200707473 | 2/2007 |
| WO | WO 03-032335 | 4/2003 |
| WO | WO 03-088356 | 10/2003 |

OTHER PUBLICATIONS

International Search Report for PCT International Application No. PCT/US2012/070569, mailed on May 14, 2013, 4 pages.

* cited by examiner

SENSORED CABLE FOR A POWER NETWORK

The invention relates to a cable for transmission of electrical power in power networks, that is equipped with a capacitive voltage sensor comprising a printed circuit board element ("PCB element") placed over an electrically isolated piece of conductive or semiconductive material, which is arranged on an insulating layer of the cable and which is operable to form an electrode of a sensing capacitor of the voltage sensor. It also relates to the use of a printed circuit board element for contacting a conductive or semiconductive layer of a power network cable.

Operators of electrical power networks monitor the state of their networks using sensors for voltage and current on their installations and on individual cables. An early example of a voltage sensor for high-voltage and medium-voltage power cables is described in the British patent GB1058890, in which the insulated conductor of the cable and a field-sensing probe electrode are surrounded by a guard electrode, and in which the guard and probe electrodes are connected to the input terminals of a high-gain amplifier.

In the German patent application DE 3702735 A1, a voltage measurement device for a cable comprises capacitive voltage divider. One of the capacitors, a high-voltage capacitor, is formed by the insulation of the central conductor of the cable and the conductive layer enveloping it. A measuring capacitor is located between the conductive layer and the shielding mesh of the cable.

The Japanese published patent application JP 60256068 A2 is related to measuring the charged voltage of a high-voltage power cable. It discloses to peel off a part of a shielding electrode of a power cable to expose an insulator. A conductive or semiconductive member is partially wound around the outer peripheral surface of the insulator to form a suspended electrode. A lead wire is embedded in and connected to said electrode.

It is an objective of the present invention to improve the electrical and mechanical contact between a voltage sensor circuit and a conductive or semiconductive layer of a cable, where the conductive or semiconductive layer of the cable is operated as an electrode of a sensing capacitor of a capacitive voltage sensor The present invention provides a sensored cable for distribution of electrical power in a power network, the sensored cable comprising an inner conductor and an insulating layer arranged concentrically around at least an axial section of the inner conductor, wherein the sensored cable further comprises a capacitive voltage sensor for sensing a voltage of the inner conductor, characterized by the sensor including a printed circuit board element, the printed circuit board element being placed over an electrically isolated piece of conductive or semiconductive material, the electrically isolated piece of conductive or semiconductive material being arranged on the insulating layer of the cable and being operable to form an electrode of a sensing capacitor of the capacitive voltage sensor.

A printed circuit board ("PCB") can establish electrical contact to the electrically isolated piece of conductive or semiconductive material in several locations. This avoids the disadvantages of having electrical contact only in one location on the piece of (semi-)conductive material, namely it avoids, firstly, problems resulting from a bad electrical contact in the one location, if that one contact is, e.g., incomplete, corroded, or damaged. In the case of, e.g., corrosion or damage, no voltage or a lower voltage can be measured on the PCB, resulting in an incorrect voltage reading of the sensor. Secondly, it also avoids problems arising from the fact that electrons travelling from a rim of the (semi-)conductive piece to the one contact location experience the electrical resistance of the (semi-)conductive piece over a longer path. This, in turn, may lead to a voltage drop and eventually to a lower, i.e. less accurate, voltage being measured on the PCB.

In contrast, the sensored cable according to the invention, having a PCB, may provide a large number of contact points on various locations on the PCB, and thereby on various locations on the (semi-)conductive piece. This creates redundancy, so that a single corroded, incomplete or damaged contact point cannot lead to an erroneous measurement of the voltage. Also, a large number of contact points will shorten the path which electrons have to travel from a rim of the (semi-)conductive piece to the next closest contact location on the PCB. This results in a much smaller voltage drop and a higher accuracy of the voltage reading.

A sensored cable according to the invention, having a capacitive voltage sensor comprising a PCB, offers the further advantage that the PCB may be adapted to support a plurality of electronic components which may serve other purposes, e.g. components that form electronic circuits for temperature compensation.

A sensored cable is a cable in combination with a sensor or comprising a sensor. A cable according to the invention comprises an inner conductor for conducting electrical power, and an insulating layer, arranged concentrically around at least an axial section of the inner conductor. The insulating layer may be arranged directly on the inner conductor.

The sensored cable according to the invention comprises a capacitive voltage sensor for sensing a voltage of the inner conductor. The sensor may be suitable for sensing a voltage of the inner conductor in relation to electrical ground potential or in relation to another electrical potential.

A capacitive voltage sensor comprises a sensing capacitor. In the sensored cable according to the invention, one electrode of the sensing capacitor may be the inner conductor or an electrically conductive element which is electrically connected to the inner conductor of the cable. The insulating layer of the cable may be operable to form a dielectric of the sensing capacitor. More broadly, a dielectric of the sensing capacitor may comprise a portion of the insulating layer of the cable.

The sensored cable according to the invention is characterized by the sensor including a printed circuit board element ("PCB element"). The PCB element is placed over an electrically isolated piece of conductive or semiconductive material (herein also referred to as "(semi-) conductive material"), which in turn is arranged on the insulating layer of the cable. The PCB element may be placed on the electrically isolated piece of (semi-) conductive material. The piece of (semi-) conductive material is operable to form an electrode of the sensing capacitor. The PCB element is thus in mechanical contact with the insulating layer via the piece of (semi-) conductive material. The piece of (semi-) conductive material may thus be arranged between the PCB element and the insulating layer. The piece of (semi-) conductive material may, for example, be a layer of (semi-) conductive material, i.e. it may have two opposed major surfaces, e.g. first and second major surfaces. The first major surface may be in mechanical contact with the insulating layer. The second major surface may be in mechanical contact with the PCB element.

The piece of (semi-) conductive material may, for example, comprise an electrically conductive metal or an electrically conductive polymer. In particular, it may comprise a layer of copper. The electrically isolated piece of (semi-) conductive material may be affixed to the insulating layer of the cable by an adhesive. The adhesive may, for example, be a pressure-sensitive adhesive or a hotmelt adhesive.

The PCB element may be in electrical contact with the piece of (semi-) conductive material. The PCB element may comprise one or more contacts for electrically contacting the piece of (semi-) conductive material. The PCB element may comprise contacts for electrically and mechanically contacting the piece of (semi-) conductive material. The PCB element may comprise a capacitor. The capacitor may be electrically connected to the piece of (semi-) conductive material. The capacitor may be operable as a secondary capacitor in a capacitive voltage divider. The capacitive voltage divider may comprise the sensing capacitor and the secondary capacitor. The capacitor and/or the capacitive voltage divider may be comprised in the capacitive voltage sensor for sensing the voltage of the inner conductor.

The PCB element may be placed over or on the piece of (semi-) conductive material such as to establish electrical contact between the PCB element and the piece of (semi-) conductive material. The PCB element is placed over the piece of (semi-) conductive material, i.e. it is arranged directly adjacent to the piece of (semi-) conductive material and it contacts the piece of (semi-)conductive material mechanically. The PCB element may have two opposed major sides. This PCB element may be placed on or over the piece of (semi-) conductive material such as to establish electrical contact between the PCB element and the piece of (semi-) conductive material. The PCB element may be attached to the piece of (semi-) conductive material. It may alternatively be in a pressure contact with the piece of (semi-) conductive material.

The PCB element may comprise a double-sided PCB, i.e. the PCB has opposed first and second major sides. Such a PCB element may be particularly advantageous in that it saves space, so that the PCB element can be integrated into the cable or kept in close vicinity to the cable, e.g. in a splice. A PCB element comprising a double-sided PCB may electrically contact the piece of (semi-) conductive material with the first side of the PCB. The double-sided PCB may comprise a contact on the first major side for electrically contacting the piece of (semi-) conductive material. The PCB may comprise a contact on the first major side for electrically and mechanically contacting the piece of (semi-) conductive material. The PCB may comprise a capacitor. The capacitor may be electrically connected to the piece of (semi-) conductive material. The capacitor may be operable as a secondary capacitor in a capacitive voltage divider. The capacitor may be arranged on the second major side of the PCB. Such a capacitor, which is arranged on the second major side may be electrically connected to a contact for electrically contacting the piece of (semi-) conductive material on the first major side through, for example, a via or an electrically conductive plated through-hole in the PCB.

The PCB element generally may comprise an exposed conductive region providing an extended two-dimensional surface contact area. The exposed conductive region may be in mechanical and electrical contact with the electrically isolated piece of (semi-) conductive material in two dimensions and over an extended area. The exposed conductive region providing an extended two-dimensional surface contact area is particularly advantageous for establishing intimate mechanical and electrical contact between the PCB element and the piece of (semi-) conductive material, because it provides many potential contact points and maximizes the contact area, which results in a more reliable contact, and less resistive losses. In embodiments in which the inner electrical resistance of the electrically isolated piece of conductive or semiconductive material is not negligible, this arrangement may provide for shorter paths which electrons need to travel through the piece of (semi-) conductive material before reaching a contact point of the PCB element. This may reduce the effect of the inner resistance of the piece of (semi-) conductive material and provide for a higher measurement precision. In general, the fact that the contact area of the PCB element is not a single conductive point, but a conductive region providing an extended two-dimensional surface contact area, enhances the accuracy and reliability of the voltage sensor. An extended two-dimensional surface contact area may be larger than the area of a single contact. It may, for example, have an area of 1 $cm^2$ or more. Because of its extension, it may touch the piece of (semi-) conductive material in a great number of contact points. These contact points may be distributed over the extended two-dimensional surface contact area. The exposed conductive region of the PCB element forms a contact for electrically and mechanically contacting the piece of (semi-) conductive material.

The exposed conductive region of the PCB element may comprise a layer of conductive metal, e.g. gold, silver, or copper. In particular, it may comprise a copper layer. The copper layer may be gold-plated for enhanced electrical contact and/or for protection against environmental influences, e.g. against corrosion.

The exposed conductive region of the PCB element may provide a continuous surface contact area or a patterned, i.e. interrupted, non-continuous, surface contact area. All parts of the patterned surface contact area may be electrically connected with each other. A patterned surface contact area may require less conductive material for manufacturing it, while having only a negligible influence on reliability of the electrical contact and resistive losses. A patterned surface contact area may also enhance the mechanical flexibility of the PCB element, thus reducing the risk of layer cracking when the PCB is bent, and of flaking. In a specific embodiment, the exposed conductive region comprises a patterned gold-plated copper layer. The pattern of the surface contact area may, for example, be a grid with a square-shaped or a diamond-shaped pattern.

The PCB element may comprise a flexible portion. An exposed conductive region as described above may be arranged on the flexible portion. In particular, the PCB element may comprise a flexible PCB. A flexible portion of the PCB element and in particular a flexible PCB may allow the PCB element to conform better to the electrically isolated piece of (semi-) conductive material. This, in turn, enhances the electrical contact between the PCB element and the piece of (semi-) conductive material and thereby makes the contact more reliable, reduces resistive losses, and facilitates higher accuracy of the voltage sensor. A flexible portion of the PCB element may also allow the PCB element to conform to cables of different diameters. In a specific embodiment, the PCB element comprises a flexible double-sided PCB.

In a specific embodiment of the invention, the sensored cable comprises a conductive or semiconductive layer (i.e., a "(semi-) conductive layer"), arranged concentrically on at least a portion of the insulating layer. The electrically isolated piece of (semi-) conductive material comprises a first portion of the (semi-) conductive layer of the cable. Thus, not a separately applied piece of (semi-) conductive is operable to form the electrode of the sensing capacitor, but a first portion of the (semi-) conductive layer of the cable is operable to form the electrode. This is a cost-effective solution. Also, the (semi-) conductive layer is normally well attached to the insulating layer and forms no voids between the insulating layer and the (semi-) conductive layer. This reduces electrical stress and reduces the risk of electrical discharges, e.g. between insulating layer and the (semi-) conductive layer, and subsequent damage to the cable. The first portion may extend along a full circumference of at least an axial portion of the insulating layer. The first portion of the (semi-) conductive layer may form a cylindrical sleeve, arranged on a portion of the insulating layer and coaxial with the inner conductor of the cable.

The sensored cable according to the invention may further comprise additional (semi-) conductive material. That additional (semi-) conductive material may be arranged concentrically around at least an axial section of the insulating layer. It may be arranged on either side of the electrically isolated piece of (semi-) conductive material. The additional (semi-) conductive material may comprise two conductive or semiconductive axial sections. One or both of these sections may extend along a full circumference of at least an axial portion of the insulating layer. Some or all of the additional (semi-) conductive material may be affixed to the insulating layer of the cable by an adhesive. One or both of the two axial sections may be electrically isolated from the electrically isolated piece of conductive or semiconductive material by non-conductive axial sections.

For a cable, which comprises a (semi-) conductive layer, arranged concentrically on at least a portion of the insulating layer, the additional semiconductive material may comprise at least second portions of the (semi-) conductive layer. This is beneficial in that it allows to use portions of the (semi-) conductive layer of the cable as additional (semi-) conductive material. Additional materials thus does not need to be applied in a separate step. This may save cost and time. These second portions of the (semi-) conductive layer of the cable may extend along a full circumference of at least respective axial portions of the insulating layer. One or both of the second portions may by electrically isolated from the electrically isolated piece of conductive or semiconductive material by non-conductive axial sections. The additional (semi-) conductive material may be affixed to the insulating layer of the cable by an adhesive. These second portions of the (semi-) conductive layer of the cable may be affixed to the insulating layer of the cable by an adhesive, they may alternatively be coated or painted on the insulating layer. They may be co-extruded with the insulating layer.

For a cable, which comprises a (semi-) conductive layer, arranged concentrically on at least a portion of the insulating layer, the electrically isolated piece of (semi-) conductive material and the additional (semi-) conductive material may be formed out of the (semi-) conductive layer of the cable. This may be achieved, for example, by removing the cable jacket, exposing the (semi-) conductive layer, and removing two annular sections or axial portions of the (semi-) conductive layer such that the axial portion of the (semi-) conductive layer between the removed axial portions forms the electrically isolated piece of (semi-) conductive material, and such that the remaining axial portions of the (semi-) conductive layer adjacent to the removed axial portions form the additional semiconductive material.

The additional (semi-) conductive material may be electrically isolated from the electrically isolated piece of (semi-) conductive material by non-conductive axial sections. These non-conductive axial sections may comprise non-conductive material or a void.

In a further aspect, the invention also provides the use of a printed circuit board element ("PCB element") for electrically contacting a conductive or semiconductive layer of a high-voltage or medium-voltage power network cable, wherein the printed circuit board element comprises an exposed conductive region providing an extended two-dimensional surface contact area, and wherein the exposed conductive region is in mechanical and electrical contact with the conductive or semiconductive layer of the cable in two dimensions and over an extended area. Use of a PCB element for that purpose is advantageous because PCBs are adapted to support a variety of electrical or electronic components. This may allow signal processing in close vicinity to the cable. The use of a PCB element may make the use of other specialized elements supporting electric or electronic components obsolete. Also, PCBs can be manufactured at relatively low cost.

The PCB element may be flexible. A flexible PCB element can be easily bent to conform around a layer of a cable. The PCB element may comprise a flexible PCB. PCBs can easily be provided with an exposed conductive region providing an extended two-dimensional surface contact area, using standard techniques.

A sensor voltage, that is indicative of the voltage of the inner conductor of the cable, may be generated on the PCB element. A sensor wire may be attached to the PCB for transmitting the sensor voltage from the PCB element to electric measurement circuitry outside the PCB element. A ground wire may be attached to an electrically grounded layer of the cable for connecting electrical ground to the electrical measurement circuitry. The electric measurement circuitry may be operational to determine the voltage of the inner conductor versus ground. In an embodiment, in which the cable comprises additional (semi-) conductive material arranged concentrically around at least an axial section of the insulating layer on either side of the electrically isolated piece of (semi-) conductive material, the ground wire may be attached to the additional (semi-) conductive material. In a specific embodiment, in which the cable comprises a (semi-) conductive layer, and wherein additional (semi-) conductive material comprises a portion of the (semi-) conductive layer, the ground wire may be attached to the (semi-) conductive layer.

Figure 2:
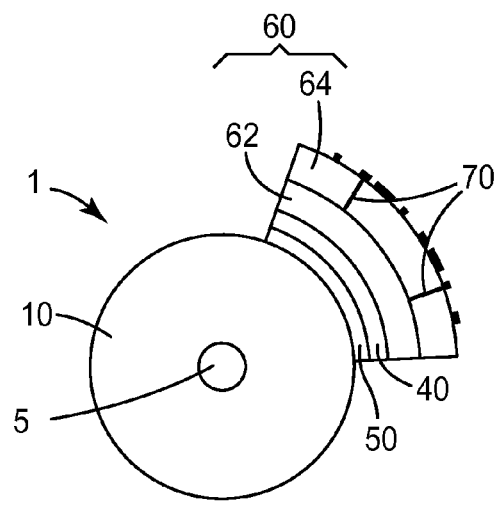
Figure 3:
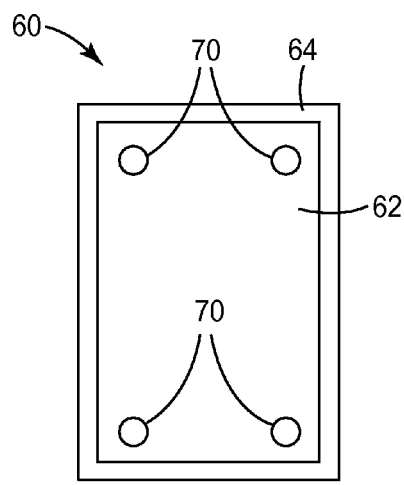
Figure 4:
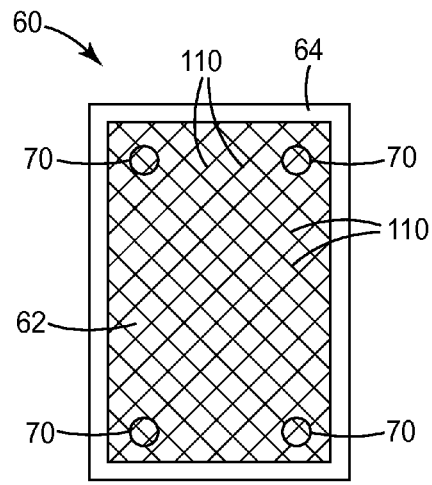
Figure 5:
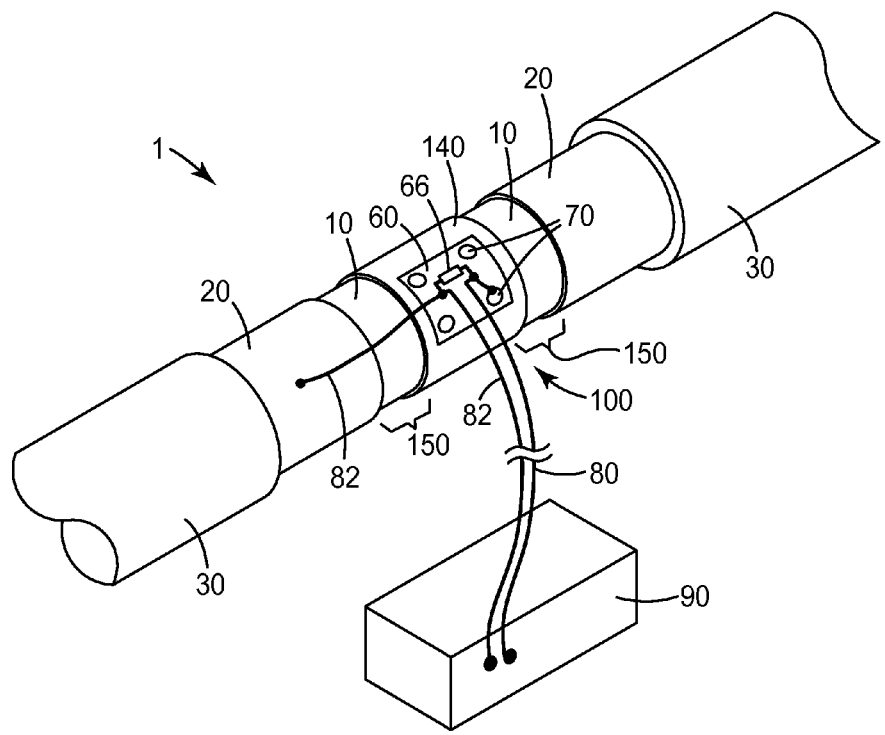
Figure 6:
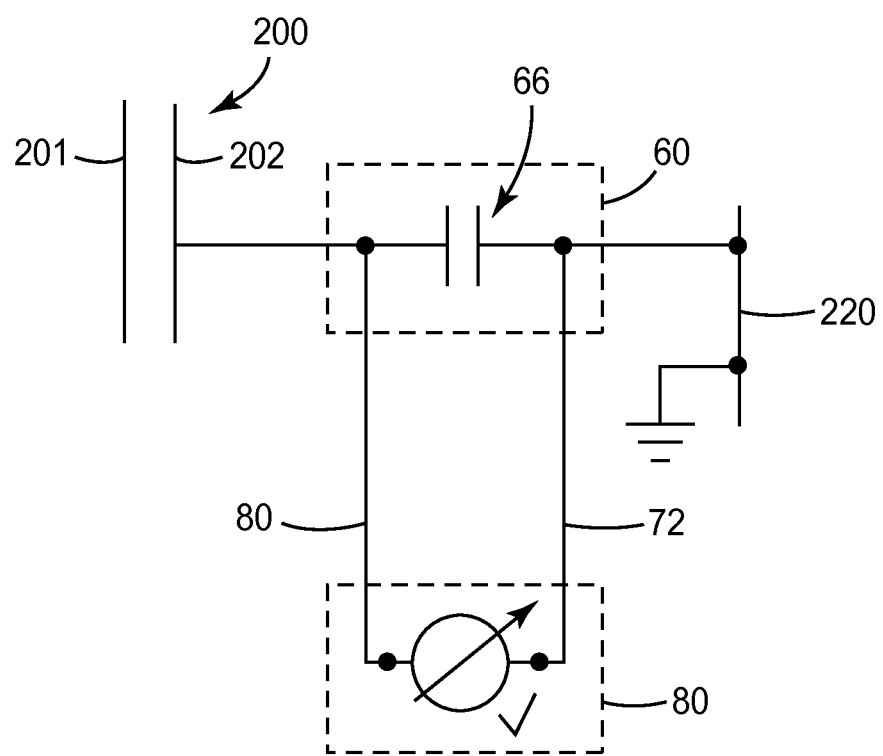

The invention will now be described in more detail with reference to the following Figures exemplifying particular embodiments of the invention:

FIG. 1 Perspective view of a sensored cable according to the invention, showing a piece of conductive material and a PCB contacting it;

FIG. 2 Cross-section of the sensored cable, the piece of conductive material and the PCB of FIG. 1;

FIG. 3 Plan view of the underside of the flexible PCB of FIGS. 1 and 2;

FIG. 4 Plan view of the underside of an alternative flexible PCB;

FIG. 5 Perspective view of an alternative sensored cable according to the invention; and FIG. 6 Electrical circuit diagram of a voltage sensor according to the invention.

Herein below various embodiments of the present invention are described and shown in the drawings wherein like elements are provided with the same reference numbers.

In the perspective view of FIG. 1, a medium- or high-voltage power network cable 1 comprises an electrically insulating layer 10, arranged around a central inner conductor (not visible in this Figure), a semiconductive layer 20 and an electrically insulating cable jacket 30. Along the length of the cable, these layers are arranged concentrically around the inner conductor. In the location of the cable shown in FIG. 1, however, the cable jacket 30 and the semiconductive layer 20 have been removed along an axial section of the cable 1, so that the insulating layer 10 is exposed. A piece of conductive material is arranged on the exposed insulating layer 10 of the cable 1, the piece forming a conductive patch 40. The patch 40 conforms to the curvature of the insulating layer 10. In the axial direction of the cable 1, it extends such as to leave space between the patch 40 and the respective edges of the semiconductive layer 20. In the circumferential direction, it extends such as to cover a fraction of the insulating layer 10, about 25% of the circumference of the insulating layer 10. The patch 40 of conductive material comprises a layer of copper, which forms a first electrode of a sensing capacitor of a voltage sensor 100, which can measure the voltage of the inner conductor of the cable 1, i.e. the voltage between the inner conductor and ground. The second electrode of the sensing capacitor is the inner conductor of the cable. The portion of the insulating layer 10 located under the patch 40 forms the dielectric of the sensing capacitor. The patch 40 is affixed to the insulating layer 10 through a thin layer of adhesive 50 on the underside (i.e. on the radially inner side) of the patch 40 of conductive material.

A double-sided flexible PCB 60 is arranged on the radially outer side of the patch 40 and electrically and mechanically contacts the outer side of the patch 40. The PCB 60 conforms to the curvature of the patch 40. The PCB 60 has, on its underside (i.e. its radially inner side) an exposed conductive region (not visible in FIG. 1), through which it contacts the outer side of the patch 40. A plurality of so-called vias 70 provide conductive paths from the exposed conductive region on the underside to conductive traces on the upper side, i.e. the radially outer side, of the PCB 60. The upper side of the PCB 60 carries conductive traces and electronic components, in particular a secondary capacitor 66 which is connected in series with the conductive patch 40. The secondary capacitor 66 forms, in combination with the sensing capacitor described above, a capacitive voltage divider. The output voltage of the capacitive voltage divider serves to measure the voltage of the inner conductor of the cable 1. This measurement technique is in principle known. The electrical circuitry will be described in greater detail below. A sensor wire 80 transmits the output voltage of the capacitive voltage divider from the PCB 60 to a measurement device 90. A ground wire 82 provides an electrical connection from the semiconductive layer 20 via the PCB 60 to the measurement device 90. The semiconductive layer 20 is normally connected to electrical ground. By determining the voltage between the output of the capacitive voltage divider and ground, and by taking into account the electrical values of the sensing capacitor and of the secondary capacitor 66, the measurement device 90 can determine the voltage of the inner conductor versus ground in known ways. The inner conductor, the semiconductive layer 20, the sensing capacitor, the secondary capacitor 66, and the PCB 60 form a capacitive voltage sensor 100. The sensing capacitor is formed by the inner conductor and the isolated conductive patch 40 as electrodes, with the insulating layer 10 being the dielectric of the sensing capacitor. The secondary capacitor 66 is a regular capacitor element, connected in series with the sensing capacitor and arranged on the PCB 60. The input of the secondary capacitor 66 is electrically connected to the sensing capacitor and to the sensor wire 80. The output of the secondary capacitor is electrically connected to the ground wire 82. The ground wire 82 is electrically connected to the semiconductive layer 20 of the cable 1. The voltage measured between sensor wire 80 and ground wire 82 is indicative of the voltage between the inner conductor and ground.

The PCB 60 mechanically and electrically contacts the electrically isolated conductive patch 40. For good, i.e, low-ohmic electrical contact, it is desirable to have a pressure contact between the exposed conductive region 62 (shown in FIG. 2) on the underside of the PCB 60 and the patch 40. The contact pressure should be high. In the embodiment shown, a shrink sleeve (not shown) is applied over the entire section of the cable in which the cable jacket 30 is removed. Before the shrink sleeve is applied and holds the PCB 60 in place, the PCB 60 can be temporarily held in its position on the conductive patch 40 by a rubber band. Once the shrink sleeve is activated, i.e. shrunk down, it presses the PCB 60 onto the patch 40. The shrink sleeve may comprise a conductive or semiconductive layer on its inside, which contacts electrically the exposed portions of the semiconductive layer 20 and connects them electrically. This layer of the shrink sleeve would then provide electrical stress control in the area of the cable 1 where the semiconductive layer 20 of the cable 1 is removed. However, in this case the PCB 60 must be electrically isolated from that (semi-) conductive inner layer of the shrink sleeve, e.g. by an isolating layer on top, i.e. on the outer side, of the PCB 60. This isolating layer could be, e.g., an electrically insulating adhesive tape, that is wound around the cable such as to cover the PCB 60 and the conductive patch 40. For fixing the PCB 60 in an alternative manner, the PCB 60 may be shaped such that it extends along an almost full circumference of the insulating layer 10 plus the patch 40. This allows to fix one end of the PCB 60 to the opposed end of the PCB 60 with a piece of adhesive tape, so that the PCB 60 is in tight pressure contact with the patch 40.

FIG. 2 is a cross-section of the sensored cable 1 of FIG. 1, taken in the plane indicated by the letter "A" in FIG. 1. For the sake of clarity, some radial dimensions have been greatly exaggerated. The inner conductor 5 of the cable 1 is surrounded concentrically by the insulating layer 10. The electrically isolated patch 40 is affixed adhesively, by adhesive layer 50, to the insulating layer 10. The flexible PCB 60 comprises the exposed conductive region 62, on the underside of the PCB 60, and the PCB substrate 64. Two vias 70 are visible, which provide conductive paths from the exposed conductive region 62 through the substrate 64 to the upper, radially outer side of the PCB 60, where conductive traces, the secondary capacitor and other electronic components are arranged.

FIG. 3 shows, in plan view, the underside of the flexible double-sided PCB 60 of FIGS. 1 and 2. The exposed conductive region 62 is a continuous area which comprises a gold-plated copper layer and which covers a major part of the underside of the PCB 60. The gold plating of the exposed conductive region 62 is applied on a layer of copper. It serves to provide high electrical conductivity and protection against corrosion of the copper. The gold plating is arranged on the layer of copper and it faces away from the substrate 64 of the PCB 60, while the layer of copper is arranged between the substrate 64 and the gold plating. At the margins of the PCB 60, the non-conductive substrate 64 of the PCB 60 is exposed, i.e. it is not covered by the exposed conductive region 62. The vias 70 provide electrical connection from the exposed conductive region 62 through the substrate 64 to the opposite side of the PCB 60. Due to its extension in two dimensions, the exposed conductive region 62 provides an extended, two-dimensional surface contact area of the PCB 60. Because of its extension, the exposed conductive region 62 can establish an extended, large surface contact with the patch 40. The large contact surface provides potentially a large number of points, where the exposed conductive region 62 and the patch 40 are in electrical contact. This makes the electrical contact reliable and potentially shortens the way which electrons have to travel through the patch 40 before reaching a contact point and enter the exposed conductive region 62.

The exposed conductive region 62 on the underside of the PCB 60 may be structured or patterned, as opposed to the continuous exposed conductive region 62 shown in FIG. 3. An example of a patterned exposed conductive region 62 is shown in plan view in FIG. 4. In this embodiment, the patterned exposed conductive region 62 is formed by a plurality of conductive traces 110, arranged in a square-shaped pattern, i.e. a cross-hatch pattern, which are electrically connected to each other. The traces 110 thus form a conductive mesh. Each conductive trace 110 comprises a gold-plated copper layer, such that the gold plating is exposed and faces away from the substrate 64 of the PCB 60. The gold plating is arranged on a layer of copper, which is arranged on the substrate 64 of the PCB 60, so that the layer of copper is arranged between the substrate 64 and the gold plating. The conductive traces 110 are spaced about 1 mm from each other. This ensures that the exposed conductive region 62 provides an extended, two-dimensional surface contact area of the PCB 60. Because of its extension, the exposed conductive region 62 can establish an extended, large surface contact with the patch 40. The large contact surface, albeit patterned, provides potentially a large number of points, where the exposed conductive region 62 and the patch 40 are in electrical contact. This makes the electrical contact reliable and potentially shortens the way which electrons have to travel through the patch 40 before reaching a contact point and enter the exposed conductive region 62.

The space between the conductive traces 110 is left free, so that, in this Figure, the substrate 64 of the PCB 60 is visible between the traces 110. The vias 70 provide electrical connection from the exposed conductive region 62 through the substrate 64 to the opposite side of the PCB 60. The vias 70 are located such that each of them is in electrical contact with at least one trace 110 of the exposed conductive region 62.

A patterned exposed conductive region 62 is believed to be more flexible than a continuous exposed conductive region 62. Bending of the PCB 60 may thus be easier, and the PCB 60 may thus conform better to the patch 40 on the insulating layer 10 of the cable 1. Also, the patterned exposed conductive region 62 shown in FIG. 4 may be bendable around smaller-radius bent patches 40 without causing cracking or flaking of the PCB 60 or of one of the layers which form the exposed conductive region 62.

The PCB 60 differs from many common PCBs in that such PCBs have solder resist layers covering the front and back surfaces of the PCB, except for conductive areas at which electrical contacts (typically by soldering) can be made. In the PCB 60 of the embodiment shown in FIG. 4, there is no solder resist on the underside of the PCB 60. A solder resist layer on the underside of the PCB 60, which typically inhibits flaking of the planar gold-plating shown in FIG. 3, is not needed because the copper layer of the exposed conductive region 62 is patterned prior to gold plating. It is believed that the patterned copper layer more easily dissipates mechanical stress than does a solid copper foil.

FIG. 5 is a perspective view of an alternative embodiment of a sensored cable 1 according to the invention. It is identical to the embodiment shown in FIGS. 1 and 2, except for the electrically isolated piece of conductive material and the presence of additional semiconductive material. While in FIG. 1 the electrically isolated piece of conductive material forms a patch 40, the electrically isolated piece of conductive material in FIG. 5 comprises a portion of the semiconductive layer 20 of the cable 1. That portion of the semiconductive layer 20 extends along a full circumference of an axial portion of the insulating layer 10. In the embodiment shown in FIG. 5, the portion of the semiconductive layer 20 forms a cylindrical sleeve 140, arranged on the insulating layer 10 and coaxial with the inner conductor 5 of the cable 1. In an axial direction, the cylindrical sleeve 140 is separated from other portions of the semiconductive layer 20 by gaps 150 on either side of the sleeve 140. The gaps 150 are non-conductive axial sections. The sleeve 140 is thus electrically isolated from the other portions of the semiconductive layer 20 by the gaps 150. This arrangement makes the sleeve 140 operable to form an electrode of a sensing capacitor of a voltage sensor 100, which can measure the voltage of the inner conductor 5 of the cable 1. The second electrode of the sensing capacitor is the inner conductor 5 of the cable. The portion of the insulating layer 10 located under the patch 40 forms the dielectric of the sensing capacitor. The sleeve 140 is affixed to the insulating layer 10 in the same way as the other portions of the semiconductive layer 20 are affixed to the insulating layer 10. This may, for example, be coextrusion, coating or by an adhesive. The sleeve 140 has the same composition as the semiconductive layer 20. This is because the sleeve 140 is formed out of the originally continuous semiconductive layer 20 of the cable 1 by removing two axial sections, i.e. the gaps 150, of that semiconductive layer 20.

In the embodiment shown, the gaps 150 in the semiconductive layer 20 are formed by removing axial sections of the originally continuous, uninterrupted semiconductive layer 20 of the cable. Thereby the gaps 150 provide electrical isolation of the sleeve 140 from the other portions of the semiconductive layer 20. This electrical isolation may also be achieved by filling one or both of the gaps 150 with a non-conductive material. The widths of the gaps 150, i.e. their axial length, may be chosen as appropriate. Normally, it is beneficial to have small gaps 150. This is because the semiconductive layer 20 is a stress control layer. In the area of the gaps 150, there is reduced or no stress control by the semiconductive layer 20. This increases the risk of locally excessively high electrical field strength which may result in electrical discharges and damage to the cable 1. This risk is smaller if the gaps 150 are smaller.

The other portions of the semiconductive layer 20, on either side of the sleeve 140, form additional semiconductive material, arranged concentrically around the insulating layer 10 on either side of the sleeve 140. The gaps 150 separate this additional semiconductive material from the sleeve 140. The additional semiconductive material thus comprises two portions of the semiconductive layer 20 of the cable 1.

The PCB 60 is arranged on the outer surface of the sleeve 140. The PCB 60, its fixation on the sleeve 140, the sensor wire 80, ground wire 82 and the measurement device 90 are identical to the corresponding elements and methods, as described in the context of FIG. 1.

FIG. 6 is an electrical circuit diagram, showing the electrical functionality of the various elements of the capacitive voltage sensor 100, according to the present invention. The sensing capacitor 200 has a first electrode 201 and a second electrode 202. The first electrode 201 corresponds to the inner conductor 5 of the cable 1, the second electrode 202 corresponds to the electrically isolated piece of conductive or semiconductive material, e.g. the patch 40 in FIG. 1 or the sleeve 140 in FIG. 5. The sensing capacitor 200 is electrically connected in series with the secondary capacitor 66, which is arranged on the printed circuit board element 60. The electrical contact between the printed circuit board element 60 and the electrically isolated piece of (semi-)conductive material is made via the exposed conductive region 62 of the printed circuit board element 60. Electrically, the secondary capacitor 66 is connected, on one side, to the sensing capacitor 200 and, on the other side, to ground. Voltage of the first electrode 201 of the sensing capacitor 200 versus ground is measured by measuring the voltage across the secondary capacitor 66. The secondary capacitor 66 is therefore electrically connected to the measurement device 90 via the sensor wire 80 and the ground wire 82. The measurement device 90 is electrically connected in parallel to the secondary capacitor 66 via the sensor wire 80 and the ground wire 82. The measurement device 90 measures the voltage between the sensor wire 80 and the ground wire 82. The ground wire 82 is electrically connected to ground via a conductive or semiconductive element 220, which corresponds to the additional semiconductive material, e.g. a portion of the semiconductive layer 20 of the cable 1. Element 220 is electrically connected to ground.

The invention claimed is:

1. Sensored cable for distribution of electrical power in a power network, the sensored cable comprising:
    an inner conductor and an insulating layer arranged concentrically around at least an axial section of the inner conductor; and
    a capacitive voltage sensor for sensing a voltage of the inner conductor, wherein the sensor includes a printed circuit board element placed over an electrically isolated piece of conductive or semiconductive material, the electrically isolated piece of conductive or semiconductive material being arranged on the insulating layer of the cable and being operable to form an electrode of a sensing capacitor of the capacitive voltage sensor, wherein the cable comprises additional conductive or semiconductive material comprising two conductive or semiconductive axial sections, and wherein the additional conductive or semiconductive material is arranged on either side of the electrically isolated piece of conductive or semiconductive material, one or both of the two axial sections of the additional conductive or semiconductive material being electrically isolated from the electrically isolated piece of conductive or semiconductive material by non-conductive axial sections.

2. Sensored cable according to claim 1, wherein the printed circuit board element comprises a double-sided printed circuit board.

3. Sensored cable according to claim 1, wherein the printed circuit board element comprises an exposed conductive region providing an extended two-dimensional surface contact area, wherein the exposed conductive region is in mechanical and electrical contact with the electrically isolated piece of conductive or semiconductive material in two dimensions and over an extended area.

4. Sensored cable according to claim 3, wherein the exposed conductive region provides a continuous surface contact area or a patterned surface contact area.

5. Sensored cable according to claim 3, wherein the printed circuit board element comprises a flexible portion, and wherein the exposed conductive region is arranged on the flexible portion.

6. Sensored cable according to claim 1, wherein the cable comprises a conductive or semiconductive layer, arranged concentrically on at least a portion of the insulating layer, and wherein the electrically isolated piece of conductive or semiconductive material comprises a first portion of the conductive or semiconductive layer.

* * * * *